US011139240B2

(12) United States Patent
Kuwabara et al.

(10) Patent No.: US 11,139,240 B2
(45) Date of Patent: Oct. 5, 2021

(54) SEMICONDUCTOR MODULE AND METHOD OF MANUFACTURING THE SAME

(71) Applicant: RENESAS ELECTRONICS CORPORATION, Tokyo (JP)

(72) Inventors: Shinichi Kuwabara, Ibaraki (JP); Yasutaka Nakashiba, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/743,468

(22) Filed: Jan. 15, 2020

(65) Prior Publication Data

US 2020/0243443 A1 Jul. 30, 2020

(30) Foreign Application Priority Data

Jan. 29, 2019 (JP) .............................. JP2019-012691

(51) Int. Cl.
*H01L 23/522* (2006.01)
*H01L 23/31* (2006.01)
*H01L 23/498* (2006.01)
*H01L 25/065* (2006.01)
*H01L 21/56* (2006.01)
*H01L 21/48* (2006.01)
*H01L 27/22* (2006.01)

(52) U.S. Cl.
CPC ...... *H01L 23/5227* (2013.01); *H01L 21/4857* (2013.01); *H01L 21/568* (2013.01); *H01L 23/3107* (2013.01); *H01L 23/49822* (2013.01); *H01L 25/0655* (2013.01); *H01L 27/22* (2013.01)

(58) Field of Classification Search
CPC .......................... H01L 23/5227; H01L 23/645
See application file for complete search history.

(56) References Cited

U.S. PATENT DOCUMENTS

| 10,103,773 | B2* | 10/2018 | Uchida ............... H01L 23/5227 |
| 10,446,485 | B2* | 10/2019 | Uchida ............... H01L 23/5227 |
| 2010/0230783 | A1 | 9/2010 | Nakashiba | |
| 2014/0346636 | A1* | 11/2014 | Miyagawa ............. H01L 24/97 257/531 |
| 2015/0035116 | A1* | 2/2015 | Nakashiba ............. H01L 23/48 257/531 |
| 2017/0359097 | A1* | 12/2017 | Uchida ................... H01L 28/10 |
| 2018/0047667 | A1* | 2/2018 | Uchida ................... H01L 28/10 |

FOREIGN PATENT DOCUMENTS

JP 2010-219122 A 9/2010

* cited by examiner

*Primary Examiner* — Nicholas J Tobergte
(74) *Attorney, Agent, or Firm* — McDermott Will & Emery LLP

(57) ABSTRACT

A semiconductor module includes a semiconductor chip including wiring formed over a semiconductor element such as a MISFET, a sealing resin part MR covering the semiconductor chip such that the wiring is exposed, and an inductor formed in redistribution wiring. The inductor overlaps with the sealing resin part covering at least a side surface of the semiconductor chip in plan view.

19 Claims, 16 Drawing Sheets

SEMICONDUCTOR MODULE AND METHOD OF MANUFACTURING THE SAME

CROSS-REFERENCE TO RELATED APPLICATIONS

The disclosure of Japanese Patent Application No. 2019-012691 filed on Jan. 29, 2019 including the specification, drawings and abstract is incorporated herein by reference in its entirety.

BACKGROUND

The present disclosure relates to a semiconductor module and a manufacturing method thereof, in particularly, the present disclosure can be suitably applied to a semiconductor module including an inductor.

In recent years, a technique has been developed in which two inductors are provided between two semiconductor chips and a signal is transmitted and received between the two inductors in a contactless manner.

For example, Japanese Unexamined Patent Application Publication No. 2010-219122 discloses a technique for forming a signal-transmitting device that transmits an electrical signal in a contactless manner between a first inductor and a second inductor by providing a first inductor in the lowermost layer of a multilayer wiring layer formed in one of two semiconductor chips and providing a second inductor in the uppermost layer of the multilayer wiring layer.

SUMMARY

When the two inductors are formed in the multilayer wiring layer inside one semiconductor chip, if a potential difference between the two inductors is large, the dielectric breakdown voltage between the two inductors cannot be sufficiently obtained due to a thin interlayer insulating film. Therefore, a technique for improving the dielectric breakdown voltage between two inductors is desired.

Other problems and novel features will become apparent from the description of this specification and the accompanying drawings.

According to embodiments, the semiconductor module includes a first semiconductor chip including a first multilayer wiring layer formed on a first semiconductor substrate and a first semiconductor substrate, and a first wiring formed in an uppermost layer of a first multilayer wiring layer, and a sealing resin part covering at least a side surface of the first semiconductor chip such that the first wiring is exposed. Further, the semiconductor module includes a first inductor overlapping with the sealing resin part formed over the first wiring and covering the side surface of the first semiconductor chip in plan view.

According to embodiments, a reliability of the semiconductor modules can be improved.

DETAILED DESCRIPTION

Figure 1:
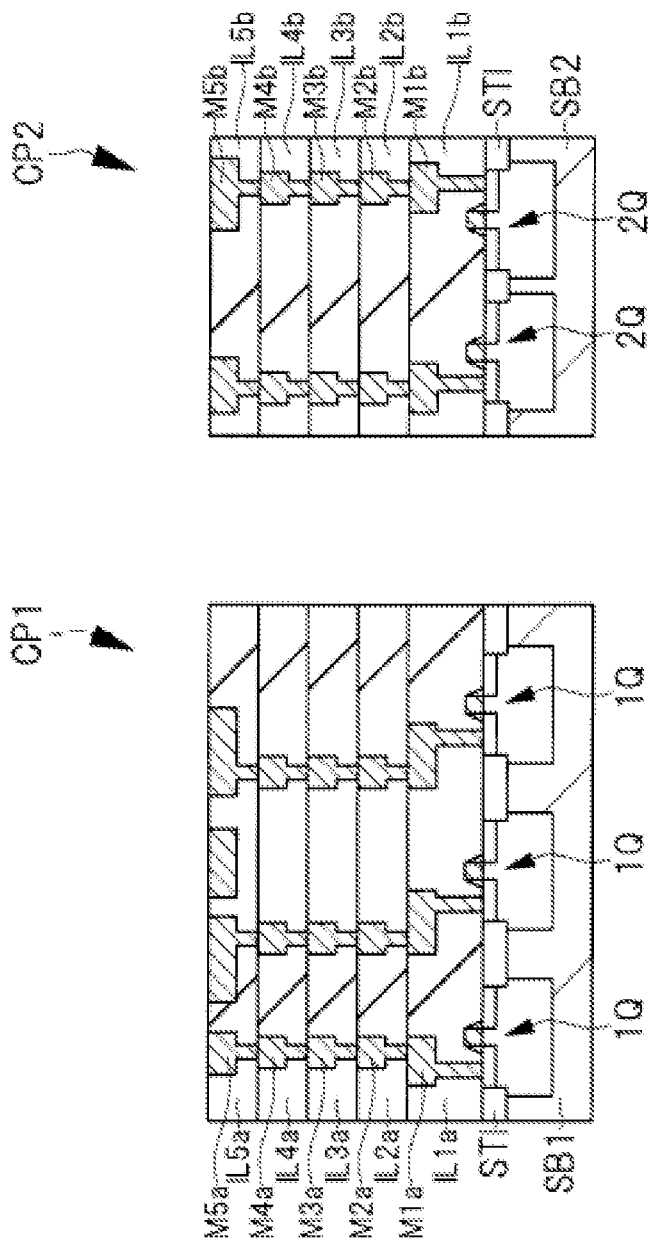
FIG. 1 is a cross-sectional view illustrating a semiconductor chip according to a first embodiment.

In the following embodiments, when required for convenience, the description will be made by dividing into a plurality of sections or embodiments, but except when specifically stated, they are not independent of each other, and one is related to modifications, detail, supplementary description, or the like of part or all of the other. In the following embodiments, reference to the number of elements or the like (including the number, numerical value, quantity, range, and the like) is not limited to the specific number, and may be greater than or equal to the specific number or less, except in the case where it is specifically specified and the case where it is obviously limited to the specific number in principle. Furthermore, in the following embodiments, it is needless to say that the constituent elements (including the element steps and the like) are not necessarily essential except in the case where they are specifically specified and the case where they are considered to be obviously essential in principle. Similarly, in the following embodiments, reference to shapes, positional relationships, and the like of constituent elements and the like includes substantially approximate or similar shapes and the like, except for the case in which they are specifically specified and the case in which they are considered to be obvious in principle and the like. The same applies to the above numerical values and ranges.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view or hatching may be added even in the case of plan view in order to make the drawings easier to see.

In the following embodiment, when expressing "B positioned directly under A" or the like, the relationship between A and B includes the case where they are in direct contact with each other and the case where there is another element between them. In other words, the relationship between A and B means that they overlap in plan view. The same relationship holds when expressing "directly above" instead of "directly below".

First Embodiment

A semiconductor module MJ1 according to present embodiment is described below with reference to FIGS. 1-3. The semiconductor module MJ1 includes a semiconductor chip CP1, a semiconductor chip CP2, an inductor ID1, and an inductor ID2.

As shown in FIG. 1, in the semiconductor chip CP1, a p-type or n-type well region is formed in the semiconductor substrate SB1, and an impurity region serving as a source region or a drain region is formed in the well region. A Gate electrode is formed on the semiconductor substrate SB1 with gate dielectric film interposed therebetween. A MISFET 1Q is a semiconductor element having the gate electrode, the gate dielectric film, and the impurity region, and is a p-type or n-type field-effect transistor. A plurality of semiconducting elements such as MISFET 1Q are formed in the semiconductor substrate SB1, and a plurality of MISFET 1Q constitute transmitting circuit.

In the semiconductor substrate SB1, element isolation part STI for isolating the respective semiconductor elements is formed. The isolation part STI is formed by filling an insulating film such as a silicon oxide film in the trench formed in the semiconductor substrate SB1.

Above the semiconductor substrate SB1, a multilayered interlayer insulating film IL1a~IL5a is formed so as to cover the MISFET 1Q. Each interlayer insulating film IL1a~IL5a is, for example, a silicon oxide film or a silicon carbonate film. In each of the interlayer insulating films IL1a~IL5a, a plurality of wiring M1a to M5a are formed as first to fifth wiring of multilayer wiring layer. The wiring M1a is electrically connected to the MISFET 1Q via a plug or the like, and the wiring M1a to M5a is electrically connected to each other via a plug or the like.

The wiring M1a to M5a is a wiring called a damascene structure or a dual damascene structure, and is a wiring in which a conductive film mainly made of copper, for example, copper is buried in a trench formed in each interlayer insulating film IL1a~IL5a via a barrier metal film such as a tantalum nitride film.

The wiring M1a to M5a may be wiring composed of a conductive film mainly composed of an aluminum film. The wiring M1a to M5a is formed of, for example, a stacked film of a first barrier metal film, an aluminum film, and a second barrier metal film. The first barrier metal film and the second barrier metal film are, for example, a titanium film or a titanium nitride film, or a stacked film thereof.

As shown in FIG. 1, in the semiconductor chip CP2, a p-type or n-type well region is formed in the semiconductor substrate SB2, and an impurity region serving as a source region or a drain region is formed in the well region. A Gate electrode is formed on the semiconductor substrate SB2 via gate dielectric film. The MISFET 2Q is a semiconductor device having the gate electrode, the gate dielectric film, and the impurity region, and is a p-type or n-type field-effect transistor. A plurality of semiconducting elements such as MISFET 2Q are formed in the semiconductor substrate SB2, and a plurality of MISFET 2Q constitute receiving circuit.

In the semiconductor substrate SB2, element isolation parts STI for isolating the respective semiconductor elements are formed. The isolation part STI is formed by filling an insulating film such as a silicon oxide film in the trench formed in the semiconductor substrate SB2.

Above the semiconductor substrate SB2, a multilayered interlayer insulating film IL1b~IL5b is formed so as to cover the MISFET 2Q. In the interlayer insulating film IL1b~IL5b, a plurality of wiring M1b to M5b are formed as first to fifth wiring of the multilayer wiring layer. The wiring M1b is electrically connected to the MISFET 2Q via a plug or the like, and the wiring M1b to M5b are electrically connected to each other via a plug or the like.

The material constituting the interlayer insulating film IL1b~IL5b is the same as the material constituting the interlayer insulating film IL1a~IL5a. The wiring M1b to M5b is a wiring having the same structure as the wiring M1a to M5a, such as a damascene structure, and the material constituting the wiring M1b to M5b is the same as the material constituting the wiring M1b to M5b.

Figure 2:
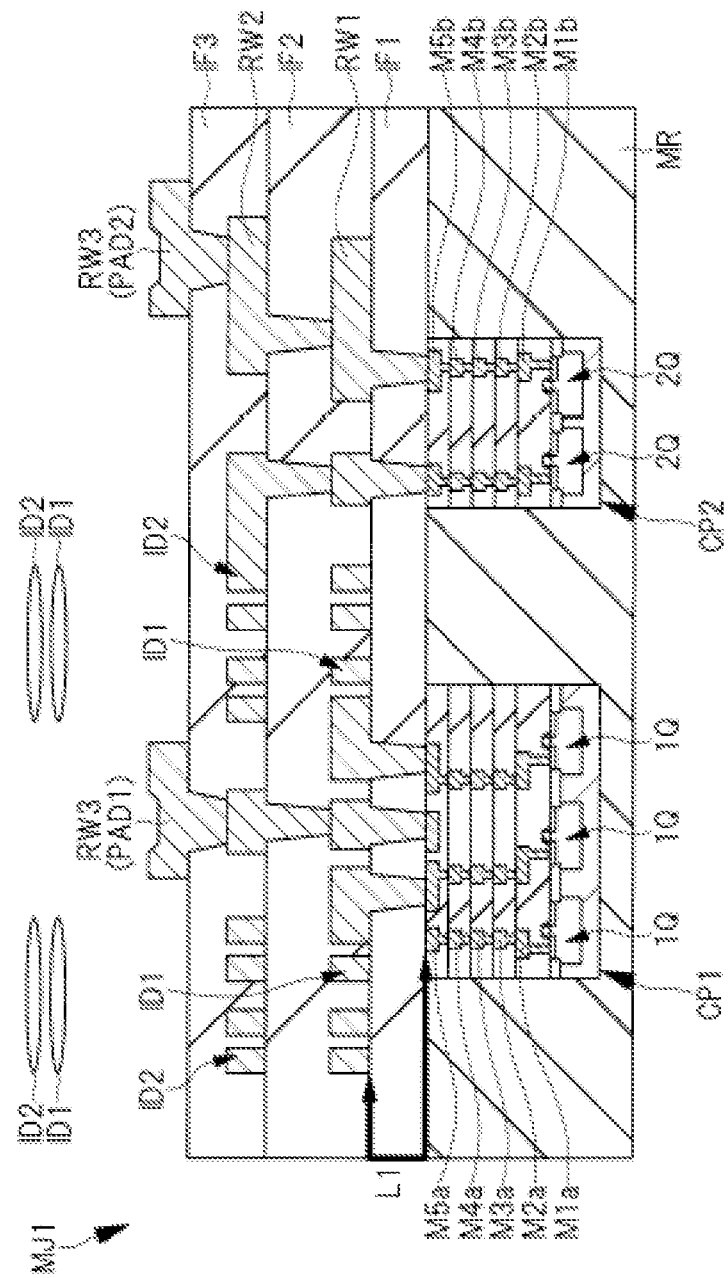
FIG. 2 is a cross-sectional view illustrating a semiconductor module according to the first embodiment.

FIG. 2 is a cross-sectional view illustrating the semiconductor module MJ1 which is a semiconductor device according to the present embodiment. The spiral inductor (coil) ID1 and the spiral inductor (coil) ID1 are formed in the semiconductor module MJ1, and are apart from each other and are formed at positions overlapping each other in plan view. The inductor ID1 and the inductor ID2 constitute a contactless communication circuit configured to propagate electrical signal in a contactless manner. It should be noted that the ellipses shown above the inductor ID1 and the inductor ID2 in FIG. 2 simply indicate the planar sizes of the inductor ID1 and the inductor ID2, each.

At least the side surfaces of the semiconductor chip CP1 and the semiconductor chip CP2 are covered by the sealing resin part MR, and the back surfaces of the semiconductor chip CP1 and the semiconductor chip CP2 are also covered by the sealing resin part MR such that the uppermost layer wiring, i.e., the wiring M5a and the wiring M5b, are exposed. That is, the semiconductor chip CP1 and the semiconductor chip CP2 are embedded in the sealing resin part MR such that the surfaces of the semiconductor chip CP1 and the semiconductor chip CP2 are exposed. The sealing resin part MR is made of, for example, a resin material such as a thermosetting resin material, and may include a filler or the like.

An insulating film IF1 is formed on the surfaces of the semiconductor chip CP1, the semiconductor chip CP2, and the sealing resin part MR, and an opening for exposing a portion of the wiring M5a and a portion of the wiring M5b is formed in the insulating film IF1. A redistribution wiring RW1 is formed on the insulating film IF1 including the inside of the opening. An insulating film IF2 is formed on the insulating film IF1 and the redistribution wiring RW1, and an opening for exposing a portion of the redistribution wiring RW1 is formed on the insulating film IF2. A redistribution wiring RW2 is formed on the insulating film IF2 including the inside of the opening. An insulating film IF3 is formed on the insulating film IF2 and the redistribution wiring RW2, and an opening for exposing a portion of the redistribution wiring RW2 is formed on the insulating film IF3. A redistribution wiring RW3 is formed on the insulating film IF3 including the inside of the opening.

A portion of the redistribution wiring RW3 is electrically connected with another semiconductor chip or a wiring substrate provided outside the semiconductor module MJ1 via a bump electrode such as a solder ball. Therefore, among the plurality of the redistribution wirings RW3, the redistribution wiring RW3 electrically connected to the wiring M5a of the semiconductor chip CP1 via the redistribution wiring RW1 and the RW2 may be referred to as a pad electrode PAD1, and the redistribution wiring RW 3 electrically connected to the wiring M5b of the semiconductor chip wiring via the redistribution wiring RW1 and the RW2 may be referred to as a pad electrode PAD2.

The insulating film IF1~IF3 is an organic insulating film made of a resin material such as polyimide, for example. Any of the insulating films IF1~IF3 may be, for example, an inorganic insulating film such as a silicon oxide film, a silicon nitride film, or a silicon oxynitride film. The redistribution wiring RW1 to RW3 includes a conductive film made of, for example, copper. Specifically, the redistribution wiring RW1 to RW3 is stacked film of a barrier metal film made of chrome or the like and the conductive film formed on the barrier metal film. A thickness of each insulating film IF1~IF3 is 10 μm to 20 μm, for example, and is thicker than a thickness of each of the interlayer insulating film IL1a~IL5b and the interlayer insulating film IL1b~IL5b. A thickness of each of the redistribution wirings RW1 to RW3 is, for example, 2 μm to 5 μm, and is thicker than a thickness of each of the wiring M5a and the wiring M5b.

In present embodiment, the inductor ID1 is constituted by a portion of a plurality of redistribution wiring RW1, and the inductor ID2 is constituted by a portion of a plurality of redistribution wiring RW2. The inductor ID1 is electrically connected to the wiring M5a of the semiconductor chip CP1, and the inductor ID2 is electrically connected to the wiring M5b of the semiconductor chip CP2 via the redistribution wiring RW1.

The transmitting circuit composed of the plurality of MISFET 1Q is electrically connected to the inductor ID1 via the wiring M1a to M5a, and a signal transmitted from the transmitting circuit flow to the inductor ID1 as a current. At this time, an induced electromotive force is generated in the inductor ID2 in accordance with a change in the current in the inductor ID1, and an induced current flow. The receiving circuit composed of the plurality of MISFET 2Q is electrically connected to the inductor ID2 via the wiring M1b to M5b. Accordingly, the receiving circuit can receive the signal transmitted from the transmitting circuit via the wiring M1a to M5a, the inductor ID1, the inductor ID2, and the wiring M1b to M5b.

A main feature of the present embodiment will be described below by comparing the semiconductor module MJ1 according to the present embodiment with a semiconductor chip CP3 according to a first comparative example and a semiconductor chip CP4 according to a second comparative example.

Figure 3:
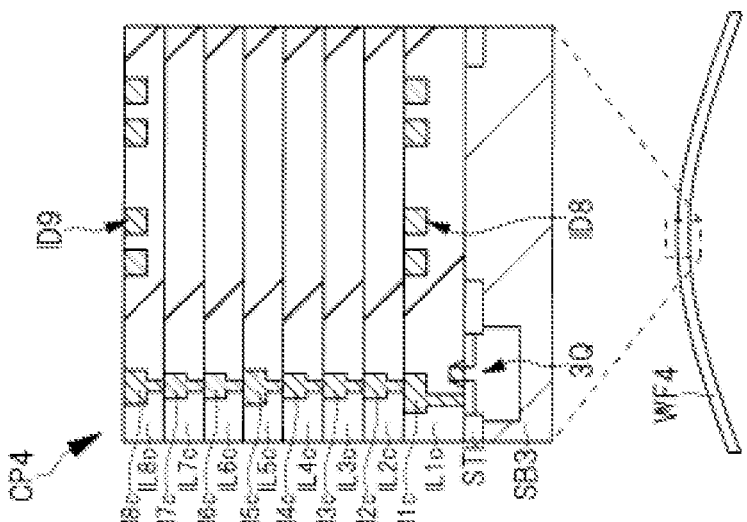
FIG. 3 is a cross-sectional view illustrating a semiconductor chip according to a comparative example.
Figure 3:
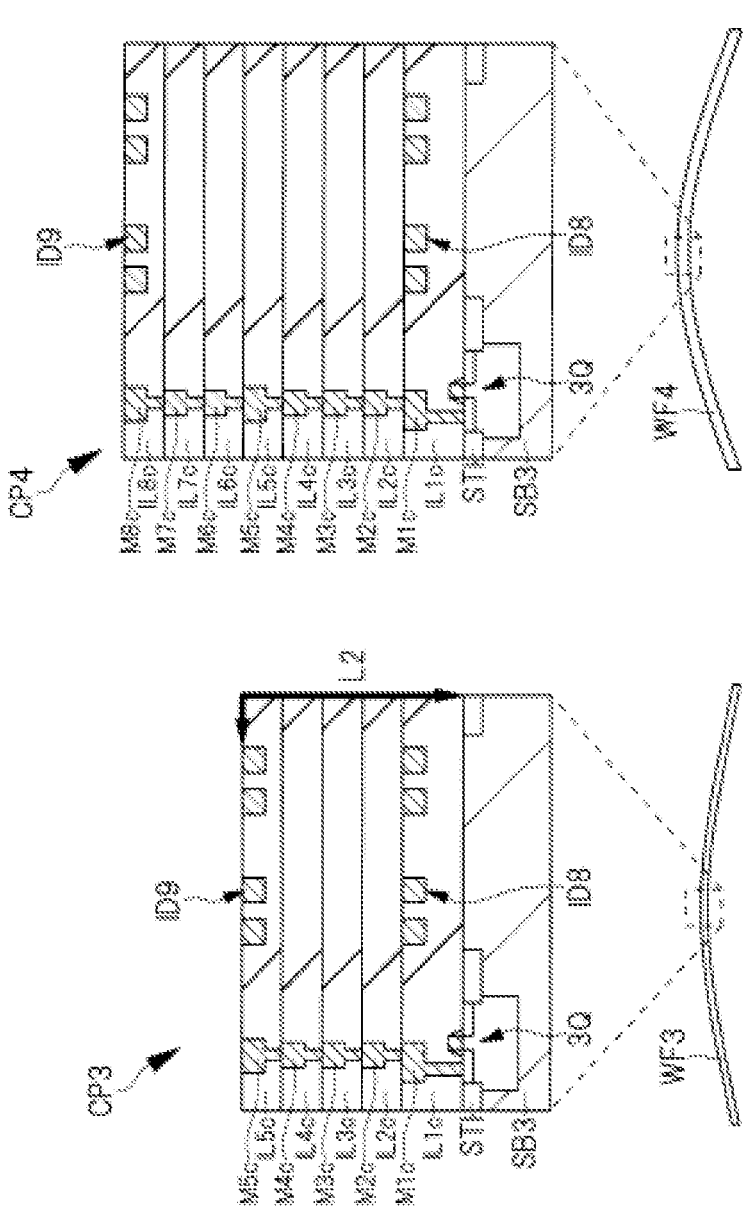

FIG. 3 shows the semiconductor chip CP3 according to the first comparative example and the semiconductor chip CP4 according to the second comparative example including an inductor ID8 and an inductor ID9, respectively. The semiconductor chip CP3 and the semiconductor chip CP4 are semiconductor chips corresponding to the semiconductor chip CP1 according to the present embodiment. Note that FIG. 3 shows a region where the semiconductor chip CP3 is formed by enlarging a portion of a wafer WF3 of the first comparative example, and further shows a region where the semiconductor chip CP4 is formed by enlarging a portion of a wafer WF4 of the second comparative example.

The semiconductor chip CP3 of the first comparative example includes a semiconductor substrate SB3, a device isolation portions STI and a MISFET 3Q; an interlayer insulating film IL1c~IL5c; and wiring M1c to M5c. These structures are similar to those of the semiconductor substrate SB1, the device isolation portions STI and MISFET 1Q, the interlayer insulating film IL1a~IL5a, and the wiring M1a to M5a in semiconductor chip CP1 according to the present embodiment.

In the first comparative example, unlike present embodiment, the inductor ID8 is formed in the same wiring layer as the wiring M1c, and the inductor ID9 is formed in the same wiring layer as the wiring M5c. That is, the inductor ID8 and the inductor ID9 are apart from each other and are formed at positions overlapping with each other in plan view to constitute a contactless communication device.

Here, in the first comparative example, when the potential difference between the inductor ID8 and the inductor ID9 is large depending on the specifications of the products, there is a possibility that the dielectric breakdown voltage between the inductor ID8 and the inductor ID9 becomes insufficient.

In order to suppress such a fear, as shown in the second comparative example, it is considered that the wiring layer and the interlayer insulating film are further multilayered. That is, in the second comparative example, an interlayer insulating film IL6c~IL8c and wiring M6c to M8c are formed in addition to the structures of the first comparative example. The inductor ID9 is formed in the same wiring as the wiring M8c. As described above, the structure of the second comparative example is effective in that the dielectric breakdown voltage between the inductor ID8 and the inductor ID9 is improved as compared with the structure of the first comparative example.

However, when the wiring layer and the interlayer insulating film are multilayered, stresses from materials constituting these layers are increased. For example, the warpage of the wafer WF4 of the second comparative example becomes greater than the warpage of the wafer WF3 of the first comparative example. Then, for example, in the step of forming the multilayer wiring layer, the warpage of the wafer WF4 becomes too great, and the wafer WF4 cannot be carried into the CVD device or the sputter device in order to form the wiring M6c to M8c of the upper layer including the inductor ID9 and the interlayer insulating film IL6c to IL8c of the upper layer. Even if the inductor ID9 can be formed in the uppermost layer, cracks and the like may occur in the interlayer insulating film IL1c~IL8c and the semiconductor substrate SB3 in which the MISFET 3Q is formed due to great stresses. Therefore, there may be a problem in that the dielectric breakdown voltage between the inductor ID8 and the inductor ID9 is deteriorated or the characteristics of the MISFET 3Q are changed.

Therefore, it is difficult to solve the various problems simply by multilayering the wiring layer and the interlayer insulating film as in the semiconductor chip CP4 of the semiconductor chip of the second comparative example.

Further, as shown in FIG. 3, the semiconductor chip CP3 of the first comparative example has problems with the creeping distance L2 between the inductor ID9 and the semiconductor substrate SB3. When the potential difference between the inductor ID9 and the semiconductor substrate SB3 is great and the creeping distance L2 is short, dielectric breakdown may occur, for example, through a surface of the interlayer insulating film IL5c and a side surface of the semiconductor chip CP3.

In order to suppress dielectric breakdown, the distance between the side surface of the semiconductor chip CP3 and the inductor ID9 may be increased and the creepage distance L2 may be increased, but in such cases, the layout of the wiring of the semiconductor chip CP3 necessaries to be largely changed, and the size of the semiconductor chip CP3 increases. Therefore, such measures are not preferable from a viewpoint of miniaturization of the semiconductor chip CP3.

Problems related to such creepage distances similarly occur between the inductor ID8 and the inductor ID9, between the inductor ID8 and the semiconductor substrate SB3, and the like. The semiconductor chip CP4 of the second comparative example also has such problems.

In a viewpoint of various problems of the first comparative example and the second comparative example, in the semiconductor module MJ1 according to the present embodiment, as shown in FIG. 2, the inductor ID1 and the inductor ID2 are not formed in the multilayer waring layer of the semiconductor chip CP1, but the redistribution wiring RW1 to RW3 is formed in the upper layer of the semiconductor chip CP1 embedded in the sealing resin part MR. An inductor ID1 is formed in the same layer as the redistribution wiring RW1, and an inductor ID2 is formed in the same layer as the redistribution wiring RW2.

Therefore, the inductor ID1 and the inductor ID2 can be arranged without being limited by the sizes of the semiconductor chips CP1. That is, the inductor ID1 and the inductor ID2 can be formed not only directly on the semiconductor chip CP1 but also directly on the sealing resin part MR. In other words, the inductor ID1 and the inductor ID2 are formed at positions overlapping with the sealing resin part MR covering at least a side surface of the semiconductor chip CP1 in plan view. Therefore, the layout of the inductor ID1 and the inductor ID2 does not depend on the layout rules of the wiring M1a to M5a in the semiconductor chip CP1. Therefore, in semiconductor module MJ1 according to the present embodiment, the design flexibility for arranging the inductor ID1 and the inductor ID2 can be increased without hindering the miniaturization of the semiconductor chip CP1.

Further, as shown in FIG. 2, in the present embodiment, since the inductor ID1 and the inductor ID2 can be formed directly above the sealing resin part MR, the creepage distance L1 can be set long. The creepage distance L1 at present embodiment is shown as the distance between the inductor ID1 and the wiring M5a connected to a potential different from the inductor ID1. That is, the creepage distance L1 in FIG. 2 is a distance along the interface between the insulating film IF2 and the insulating film IF1, the side surface of the semiconductor module MJ1, the interface between the insulating film IF1 and the sealing resin part MR, and the interface between the insulating film IF1 and the interlayer insulating film IL5a.

Here, in present embodiment, a distance of the interface between the insulating film IF2 and the insulating film IF1 and the distance of the interface between the insulating film IF1 and the sealing resin part MR can be freely set out of the creeping distance L1, such that the distance in the horizontal direction can be set longer. In other words, the distance between the inductor ID1 and the side surface of the semiconductor module MJ1 can be set longer than the distance between the wiring M5a and the semiconductor chips CP1. In addition, by adjusting a thickness of the insulating film IF1 in a thickness direction, a length of the side surface of the semiconductor module MJ1 can be set longer in the thickness direction. Therefore, dielectric breakdown between the inductor ID1 and the wiring M5a can be suppressed.

Figure 4:
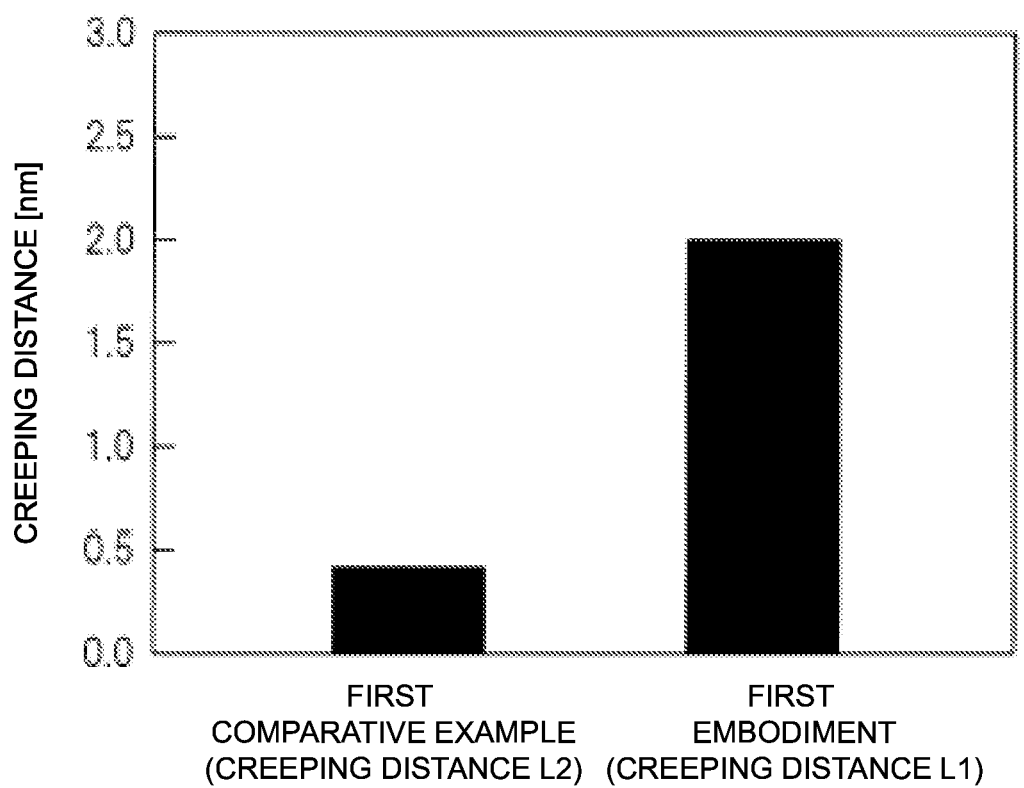
FIG. 4 is a diagram illustrating experimental data by the inventors of the present application.

FIG. 4 shows data obtained by experiments of the present inventors. As shown in FIG. 4, the creeping distance L2 of the first comparative example was about 0.4 mm, whereas the creeping distance L1 of present embodiment was about 2.1 mm. As described above, in present embodiment, since the creeping distance L1 can be set without being limited by the sizes of the semiconductor chips CP1, it is possible to improve the dielectric strength between the inductor ID1 and the wiring M5a caused by the creeping distance.

In the present embodiment, although the creeping distances L2 between the inductor ID1 and the wiring M5a connected to a potential different from the inductor ID1 are exemplified, the same relationships are also established among other configurations. For example, since the creeping distances between the inductor ID2 and the inductor ID1, between the inductor ID2 and the wiring M5a, between the inductor ID2 and the semiconductor substrate SB1, and between the inductor ID1 and the semiconductor substrate SB1 can be set to be longer, the dielectric strength voltage between them can be improved.

In present embodiment, the distance between the inductor ID1 and the inductor ID2 can be adjusted relatively easily by appropriately changing the thickness of the insulating film IF2, for example, 10 μm to 20 μm. Therefore, it is possible to improve the dielectric breakdown voltage between the inductor ID1 and the inductor ID2 without causing the problem of warpage of the wafer for forming the semiconductor chip CP1 and the problem of cracking in the interlayer insulating film due to the multilayering of the wiring layer and the interlayer insulating film of the semiconductor chip CP1.

As described above, the present embodiment can improve the reliability of the semiconductor module MJ1.

Hereinafter, a method of manufacturing a wafer WF1, WF2 including a plurality of regions to be semiconductor chips CP1 and CP2 according to the present embodiment will be described with reference to FIGS. 5 and 6. Actually, the manufacturing step of the wafer WF1, WF2 is performed individually. However, since the manufacturing step of the wafer WF1, WF2 includes many substantially similar step, in the following explanation, the wafer WF1, WF2 is illustrated in the same drawing for simplification of explanation, and the same processes will be explained together.

Figure 5:
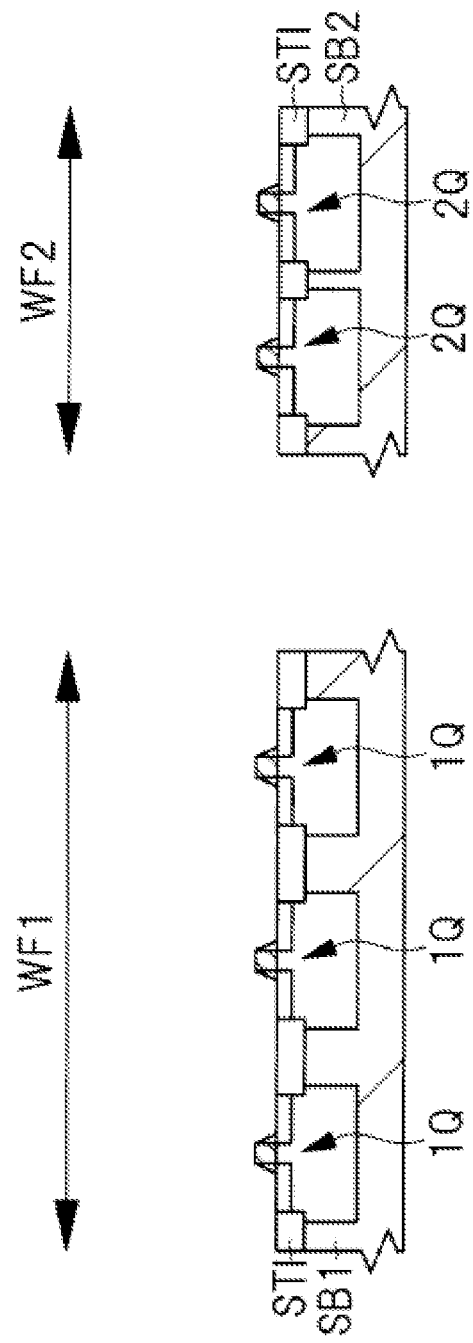
FIG. 5 is a cross-sectional view illustrating a step of method of manufacturing the semiconductor chip according to the first embodiment.

First, as shown in FIG. 5, the semiconductor substrate SB1 and SB2 are provided as bases of wafer WF1, WF2. The semiconductor substrate SB1 and SB2 are preferably made of monocrystalline silicon having a resistivity of about 1 to 10 Ωcm, and are made of, for example, p-type monocrystalline silicon. Next, a trench is formed in the semiconductor substrate SB1 and SB2 by photolithography and etch treatment. Next, an insulating film made of, for example, a silicon oxide film is deposited on the semiconductor substrate SB1 and the SB2 including the inside of the trench by, for example, the CVD method. Next, the insulating film outside the trench is removed by polishing the insulating film by a Chemical Mechanical Polishing (CMP) method. As described above, the element isolation portion STI is formed by burying the insulating film in the trench.

Next, p-type or n-type well region is formed in the semiconductor substrate SB1 and SB2 by photolithography and ion implantation. Next, the gate dielectric film and the gate electrode are formed on the semiconductor substrate SB1 and SB2, and thereafter, impurity region serving as source region and drain region is formed in the semiconductor substrate SB1 and SB2 by photolithography and ion implantation, thereby forming MISFET 1Q, 2Q in the semiconductor substrate SB1 and SB2, respectively.

Figure 6:
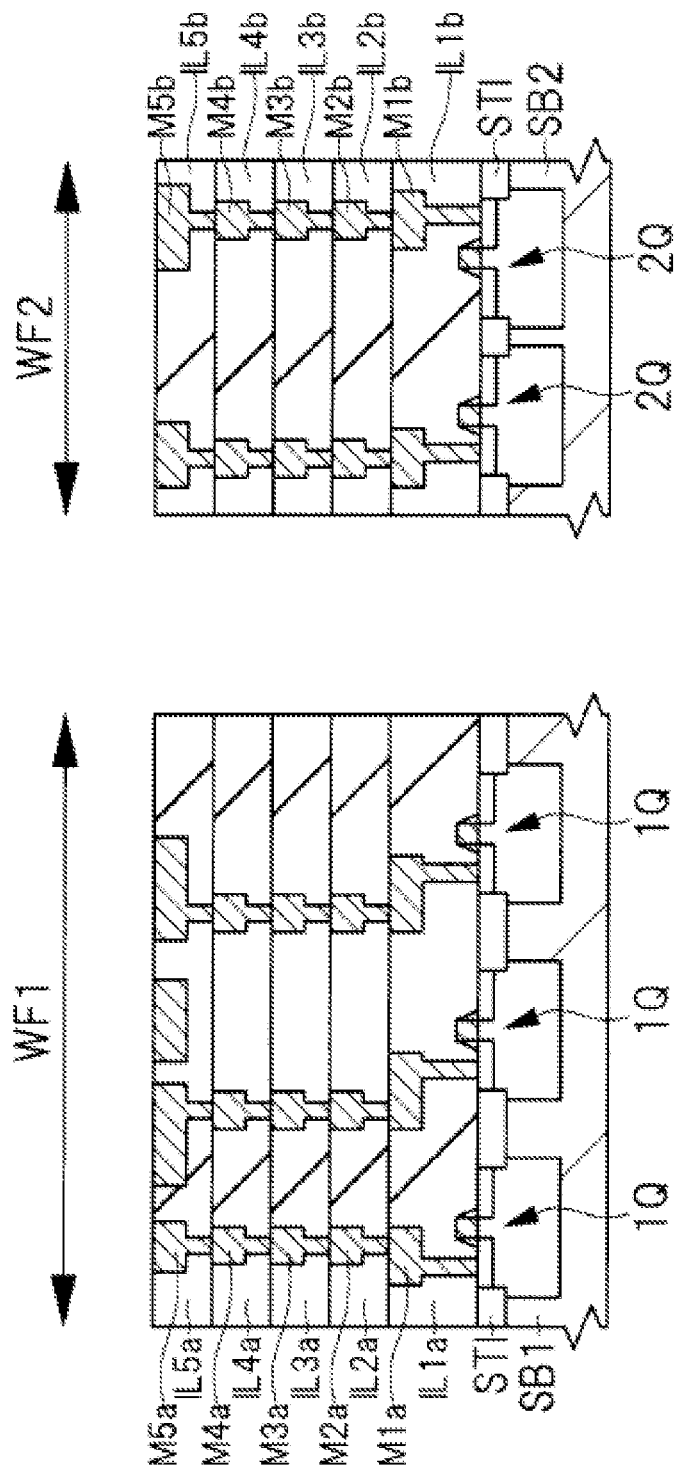
FIG. 6 is a cross-sectional view illustrating a manufacturing step following FIG. 5.

Next, as shown in FIG. 6, the interlayer insulating film IL1a~IL5a and the wiring M1a to M5a are formed on the semiconductor substrate SB1 so as to cover the MISFET 1Q, and the interlayer insulating film IL1b~IL5b and the wiring M1b to M5b are formed on the semiconductor substrate SB2 so as to cover the MISFET 2Q.

First, an interlayer insulating film IL1a, IL1b is formed on each of the semiconductor substrate SB1 and SB2 by, e.g., CVD method. Next, a via is formed in the interlayer insulating film IL1a, IL1b by a photolithography method and an etch treatment, and then a trench for the wiring is formed in the interlayer insulating film IL1a, IL1b. Next, a barrier metal film composed of a stacked film of a tantalum film and a tantalum nitride film is formed on the interlayer insulating film IL1a, IL1b including the inside of each of the via and the trench for the wiring by a sputtering method or a CVD method. Next, a conductive film made of copper, for example, is deposited on the barrier metal film by, e.g., plating. Next, the conductive film and the barrier metal film are polished by the CMP method to remove the conductive film and the barrier metal film outside each of the via and the trench for the wiring. As described above, the conductive film and the barrier metal film are buried in each of the via and the trench for the wiring, thereby forming the wiring M1a and the wiring M1b having a dual damascene in which the wiring M1a and the wiring M1b includes the plug.

The wiring M1a and the wiring M1b may not have a dual damascene structure, but may have a damascene structure in which the plug and the wiring portion are separately formed. That is, the plug may be formed by embedding the conductive film and the barrier metal film in the via, and thereafter, the conductive film and the barrier metal film may be embedded in the trench for the wiring to form the wiring M1a and the wiring M1b serving as wiring portion.

Thereafter, an interlayer insulating film IL2a~IL5a, IL2b~IL5b is formed on the interlayer insulating film IL1a, IL1b by a same technique as the forming step of the interlayer insulating film IL1a, IL1b. In each of the interlayer insulating film IL2a~IL5a, IL2b~IL5b, the wiring M2a to M5a and M2b to M5b is formed by the same technique as the forming step of the wiring M1a and M1b.

Thereafter, the wafer WF1, WF2 is singulated by a dicing step, whereby a plurality of semiconductor chips CP1, CP2 shown in FIG. 1 are obtained. As described above, the semiconductor chip CP1, CP2 is provided.

Hereinafter, the method of manufacturing the semiconductor module MJ1 according to the present embodiment will be described with reference to FIGS. 7 to 13.

Figure 7:
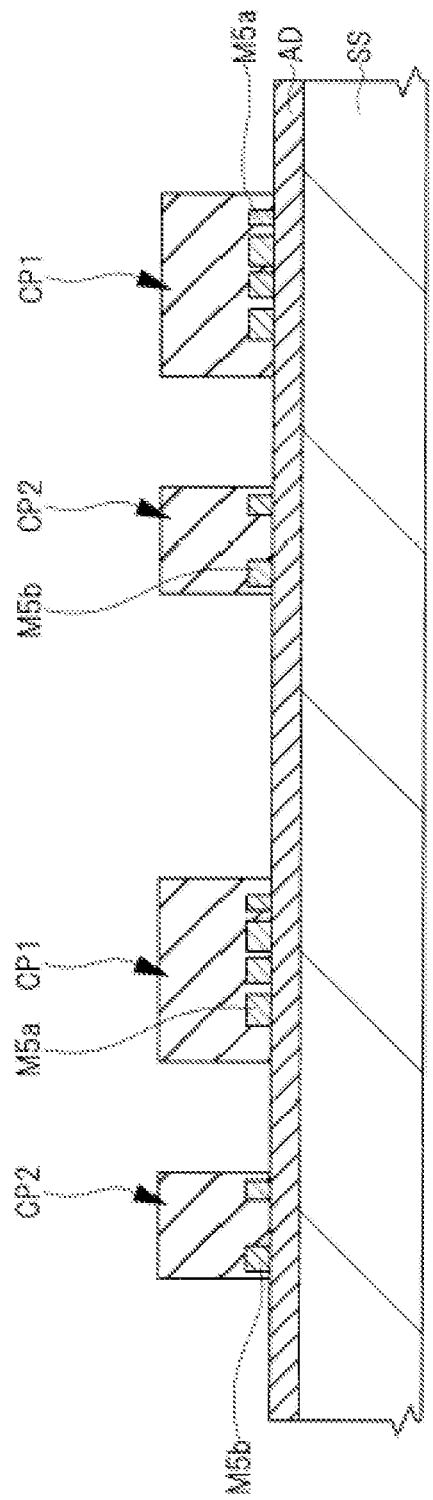
FIG. 7 is a cross-sectional view illustrating a manufacturing step of the semiconductor module according to first embodiment.

First, as shown in FIG. 7, a support substrate SS and an adhesive agent AD formed (coated) on the support substrate SS are provided. The adhesive agent AD is, for example, a double-sided tape. Next, a plurality of sets of semiconductor chips CP1 and a plurality of sets of semiconductor chips CP2 are mounted on the adhesive agent AD with one set of the semiconductor chips CP1 and one set of the semiconductor chips CP2 manufactured in FIG. 6. The surfaces (wiring M5a, M5b) of the semiconductor chip CP1 and one semiconductor chip CP2 are attached on the adhesive agent AD.

Figure 8:
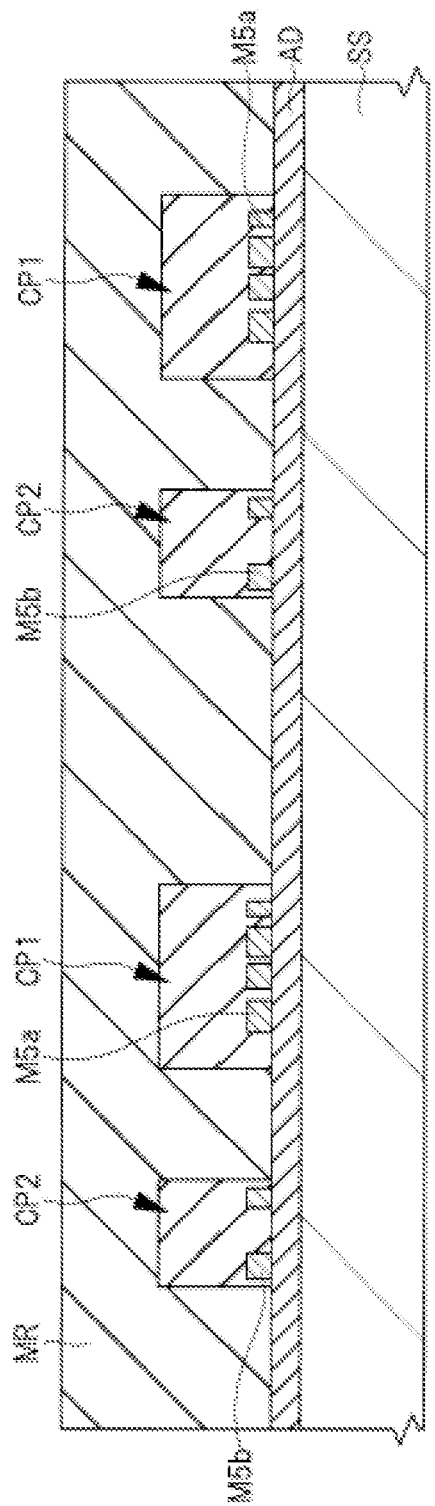
FIG. 8 is a cross-sectional view illustrating a manufacturing process following FIG. 7.

Next, as shown in FIG. 8, a sealing resin part MR is formed on the adhesive agent AD so as to cover a plurality of sets of semiconductor chips CP1 and semiconductor chips CP2. Next, the sealing resin part MR is flattened by a polishing step using CMP method.

Figure 9:
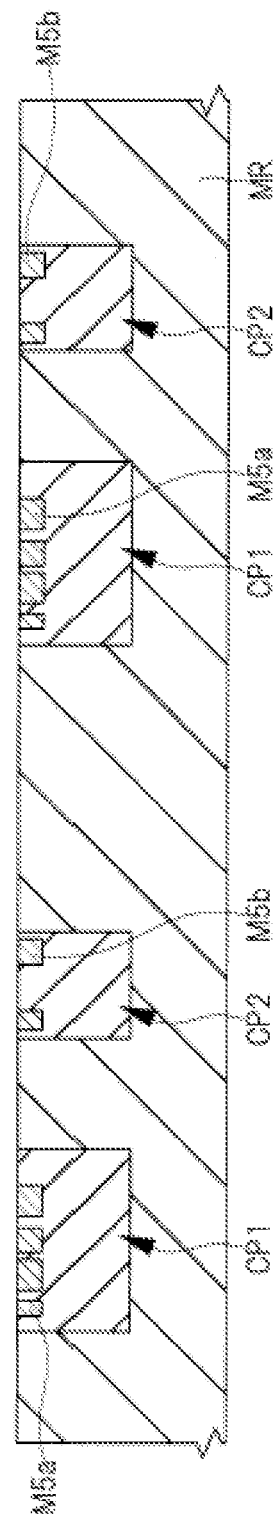
FIG. 9 is a cross-sectional view illustrating a manufacturing step following FIG. 8.

Next, as shown in FIG. 9, the adhesive agent AD and the support substrate SS are removed. In this condition, at least each side surface of the semiconductor chip CP1, CP2 is covered with the sealing resin part MR, and each back surface of the semiconductor chip CP1, CP2 is also covered with the sealing resin part MR. The surfaces (wiring M5a and M5b) of the semiconductor chip CP1, CP2 are exposed from the sealing resin part MR.

Figure 10:
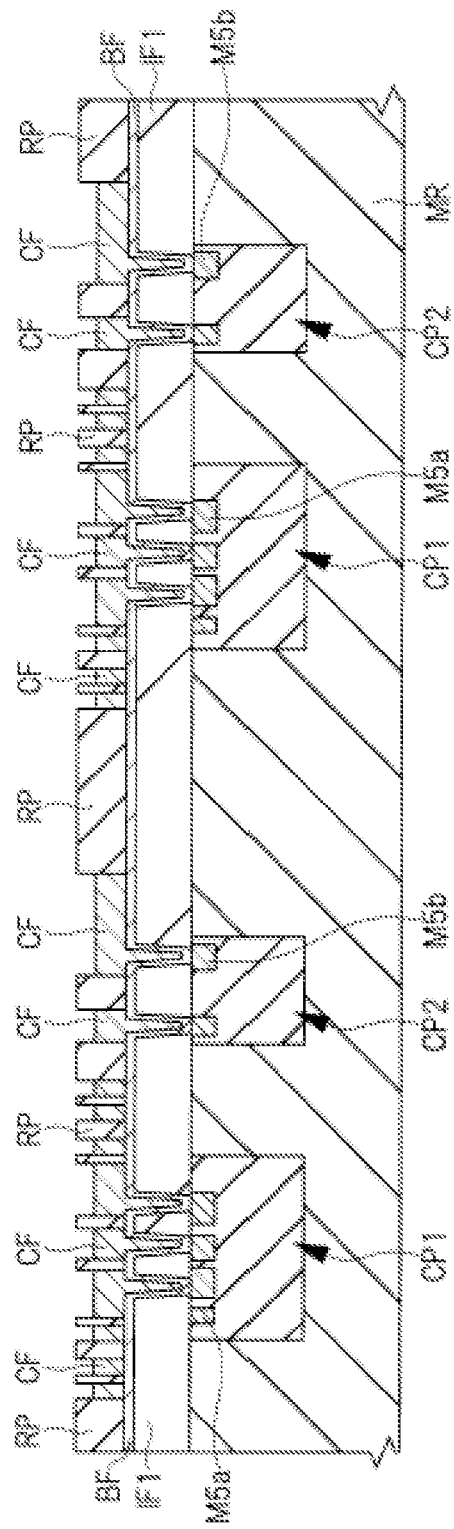
FIG. 10 is a cross-sectional view illustrating a manufacturing step following FIG. 9.
Figure 11:
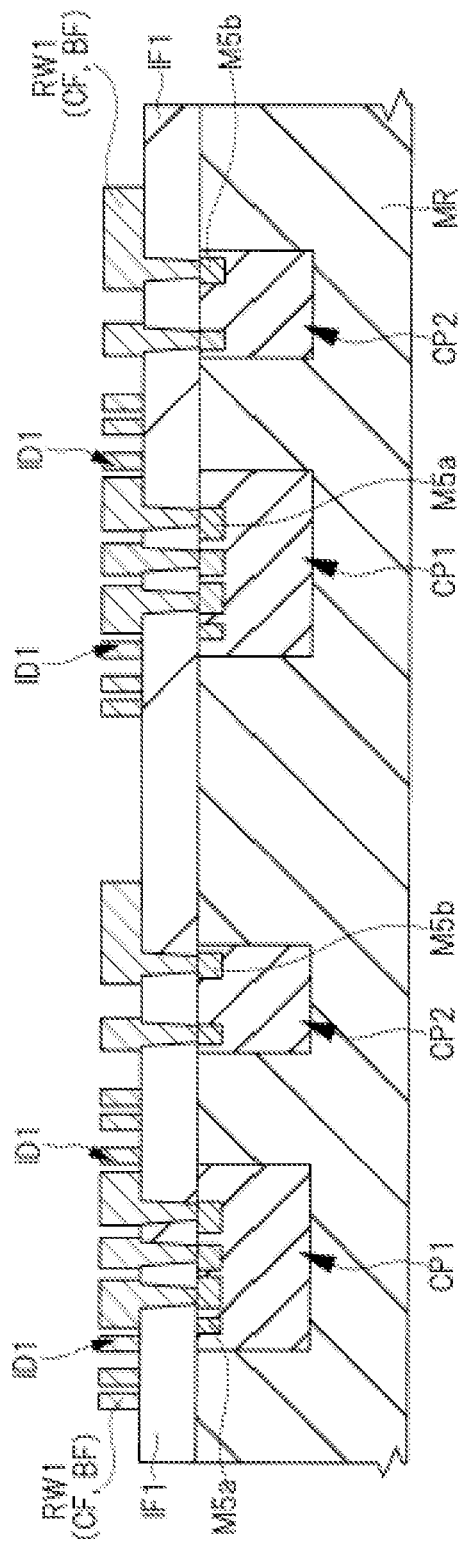
FIG. 11 is a cross-sectional view illustrating a manufacturing step following FIG. 10.
Figure 12:
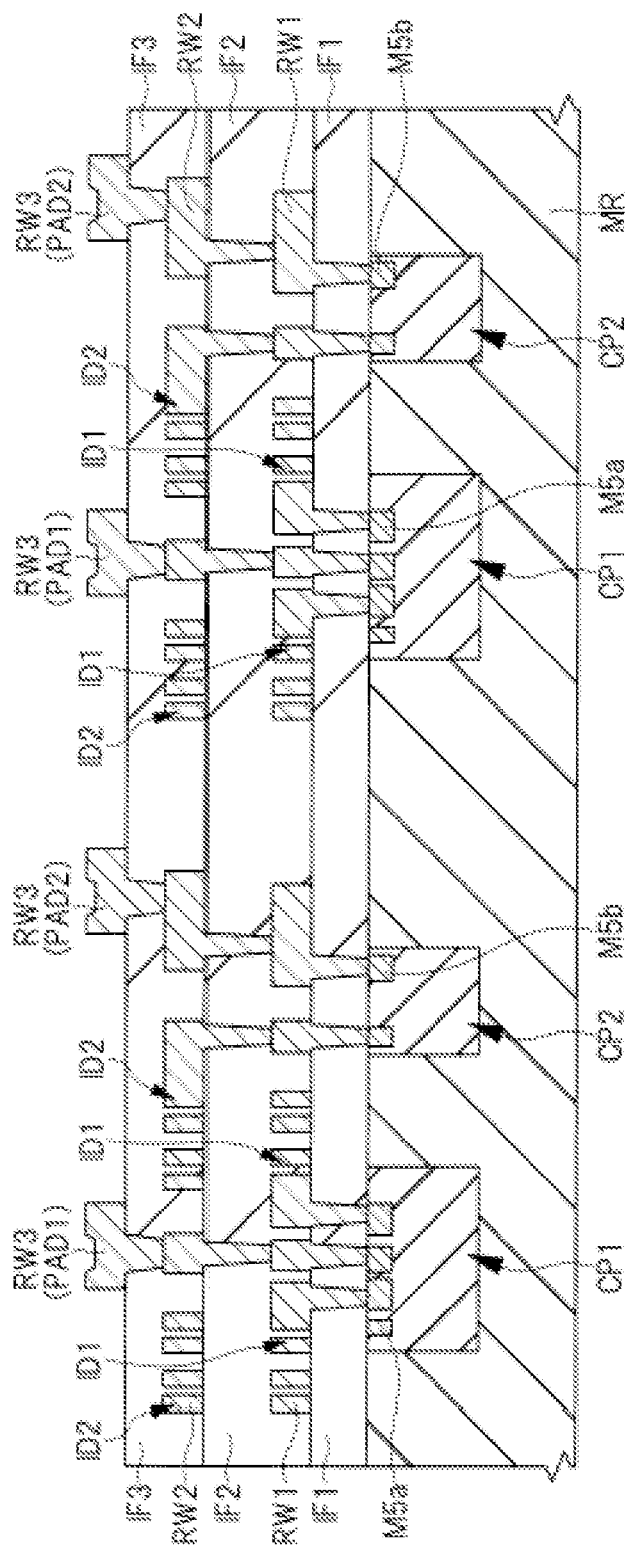
FIG. 12 is a cross-sectional view illustrating a manufacturing step following FIG. 11.

Next, as shown in FIGS. 10 to 12, an insulating film IF1-IF3 and redistribution wiring RW1 to RW3 are formed on the surfaces of the semiconductor chip CP1, the semiconductor chip CP2, and the sealing resin part MR, respectively.

First, as shown in FIG. 10, an insulating film IF1 is formed on the surface of each of the wiring M5a and M5b, the interlayer insulating film IL5a, IL5b, and the sealing resin part MR by, for example, a coating method. The insulating film IF1 is an organic insulating film made of a resin material such as polyimide, for example. Next, a portion of the insulating film IF1 is subjected to photosensitive process and development treatment, whereby a plurality of openings are formed in the insulating film IF1. In these openings, the wirings M5a and M5b are exposed. When the insulating film IF1 is an inorganic insulating film such as a silicon nitride film, the plurality of openings is formed in the insulating film IF1 by photolithography and dry etching.

Next, a barrier metal film made of chrome or the like is formed on the insulating film IF1 and on the wiring M5a and M5b exposed in the opening by a sputtering method, and a thin copper film serving as a seed layer is formed on the barrier metal film. In FIG. 10, a stacked film of a barrier metal film and a seed layer is illustrated as a base film BF. Next, a claim pattern RP is formed on the insulating film IF1 via the base film BF, the resist pattern RP having a plurality of openings for exposing a region to be redistribution wiring RW1. Next, a conductive film CF made of copper, for example, is formed on the seed layer of the base film BF exposed from the plurality of openings of the resist pattern RP by plating.

Next, as shown in FIG. 11, the resist pattern RP is removed by asking, and subsequently, the base film BF exposed from the conductive film CF is removed by wet etching or the like. In this state, the seed layer of the base film BF is taken in by the conductive film CF. By such a step, a plurality of redistribution wiring RW1 connected to the wiring M5a and M5b and having the base film BF and the conductive film CF are formed. In present embodiment, the plurality of redistribution wiring RW1 include an inductor ID1, and the inductor ID1 is formed at a position overlapping with the sealing resin part MR covering at least the side surface of the semiconductor chip CP1 in plan view.

Next, as shown in FIG. 12, an insulating film IF2 having an opening is formed on the redistribution wiring RW1 and the insulating film IF1 by the same technique as the insulating film IF1. Next, the redistribution wiring RW2 is formed on the insulating film IF2 including the inside of the opening by using the same technique as the wiring RW1. In the present embodiment, a part of the plurality of the redistribution wiring RW2 includes an inductor ID2, and the inductor ID2 is formed at a position overlapping at least the sealing resin part MR covering the side surface of the semiconductor chip CP1 in plan view.

Next, an insulating film IF3 having an opening is formed on the redistribution wiring RW2 and the insulating film IF2 by the same technique as the insulating film IF2. Next, the redistribution wiring RW3 (pad-electrode PAD1, PAD2) is formed on the insulating film IF3 including the inside of the opening by using the same technique as the redistribution wiring RW2.

Figure 13:
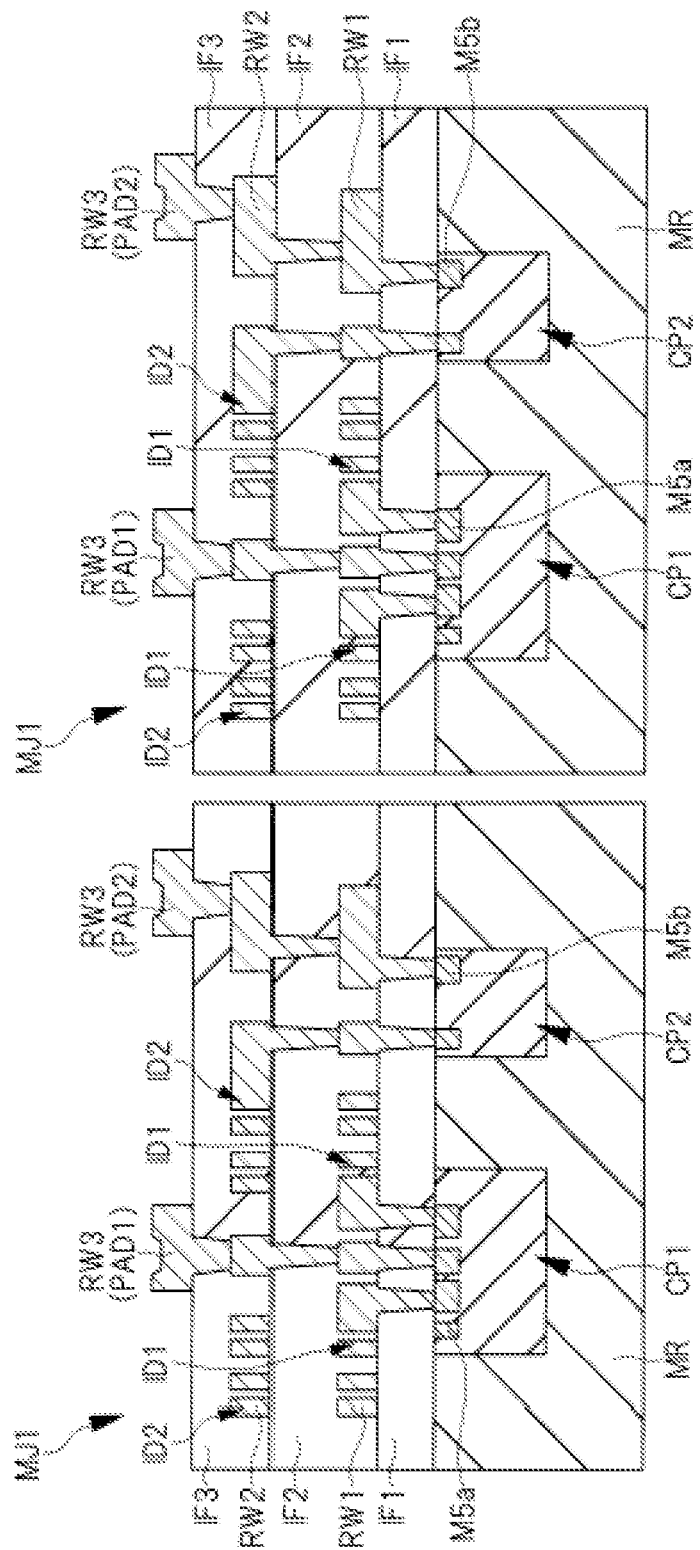
FIG. 13 is a cross-sectional view illustrating a manufacturing step following FIG. 11.

Next, as shown in FIG. 13, the insulating film IF1-IF3 and the sealing resin part MR are divided by a dicing process so that one semiconductor chip CP1 and one semiconductor chip CP2 form one set. As a result, a plurality of semiconductor modules MJ1 shown in FIG. 2 are obtained.

Hereinafter, the semiconductor module MJ2 according to the second embodiment will be described with reference to FIG. 14. Hereinafter, differences from semiconductor module MJ1 according to the first embodiment will be mainly described.

In the first embodiment, the inductor ID1 and the inductor ID2 are formed in the same layers as the redistribution wiring RW1 and the redistribution wiring RW2, respectively, and are disposed at positions overlapping with each other in plan view.

Figure 14:
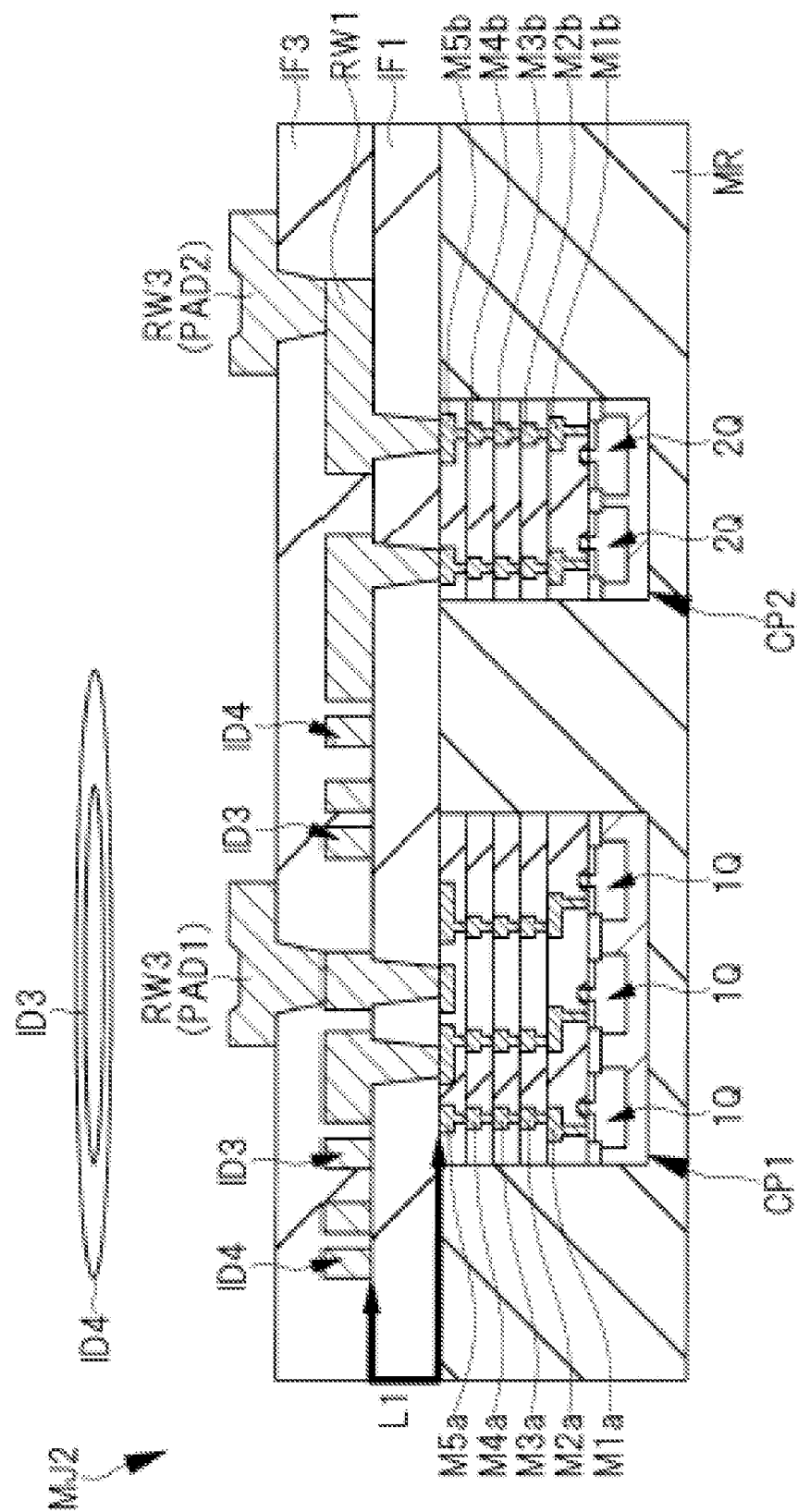
FIG. 14 is a cross-sectional view illustrating a semiconductor module according to a second embodiment.

As shown in FIG. 14, in second embodiment, the inductor ID3 and the inductor ID4 are formed in the same layers as the redistribution wiring RW1. Therefore, in second embodiment, the insulating film IF2 and the redistribution wiring RW2 are not formed. The planar size of the inductor ID4 is greater than the planar size of the inductor ID3.

In the second embodiment, similarly to the first embodiment, the inductor ID3 and the inductor ID4 are formed at positions overlapping with the sealing resin part MR covering at least the side surface of the semiconductor chip CP1 in plan view. Therefore, the inductor ID3 and the inductor ID4 can be arranged without being limited by the size of the semiconductor chip CP1 and without depending on the layout rules of the wiring M1a to M5a in the semiconductor chip CP1. Therefore, the degree of freedom in designing the arrangement of the inductor ID3 and the inductor ID4 can be increased without hindering the miniaturization of the semiconductor chip CP1.

In addition, since the speed is not limited by the size of the semiconductor chip CP1, the planar size of each of the inductor ID3 and the inductor ID4 can be made greater than the planar size of the semiconductor chip CP1. Therefore, the degree of flexibility in designing the inductor ID3 and the inductor ID4 can be further increased.

Since the creepage distance L1 of the second embodiment can be set in the same manner as the creepage distance L1 of the first embodiment, dielectric breakdown between the inductor ID3 and the wiring M5a or between the inductor ID4 and the wiring M5a can be suppressed.

Further, in second embodiment, since the insulating film IF3 is formed between the inductor ID3 and the inductor ID4, the dielectric breakdown voltage between the inductor ID1 and the inductor ID2 can be easily improved by appropriately adjusting the distances therebetween.

As described above, the reliability of the semiconductor module MJ2 can also be improved in the second embodiment.

In semiconductor module MJ2 according to the second embodiment, although the insulating film IF2 and the redistribution wiring RW2 are not formed, these semiconductor modules may be formed. The inductor ID3 and the inductor ID4 may be formed in the same layer as the redistribution wiring RW1, or may be formed in the same layer as the redistribution wiring RW2.

Hereinafter, the semiconductor module MJ3 according to the third embodiment will be described with reference to FIG. 15. Hereinafter, differences from semiconductor module MJ2 according to the second embodiment will be mainly described.

Figure 15:
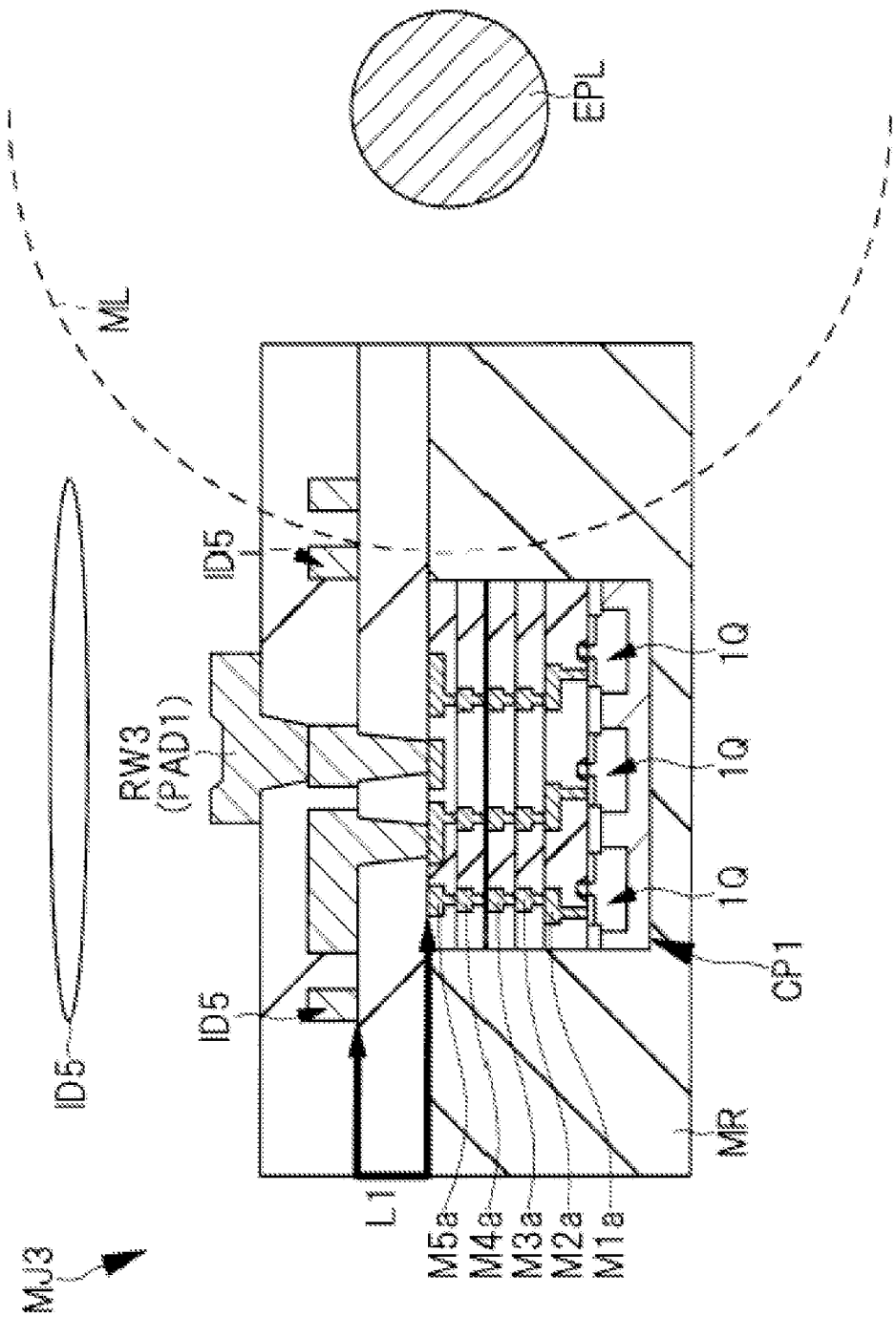
FIG. 15 is a cross-sectional view illustrating a semiconductor module according to a third embodiment.

As shown in FIG. 15, the insulating film IF2 and the redistribution wiring RW2 are not formed in the third embodiment similarly to the second embodiment. The inductor ID5 is formed in the same layer as the layer of the redistribution wiring RW1. A power line EPL is disposed outside the semiconductor module MJ3, and a magnetic field line (magnetic) ML from the power line EPL is shown by a broken line in FIG. 14.

The inductor ID5 according to the third embodiment is configured to detect the magnetism from the power line EPL and forms part of the circuit for the magnetic sensor (power meters). The inductor ID5 is connected to the redistribution wiring RW1 and is electrically connected to the MISFET 1Q. In third embodiment, the MISFET 1Q constitutes a part of the electric circuit for the magnetic sensor. Therefore, in the semiconductor module MJ3, the semiconductor chip CP2 is not indispensable, and if at least the inductor ID5 and the semiconductor chip CP1 are provided, the semiconductor module MJ3 can function as a magnetic sensor.

In third embodiment, as in first embodiment and second embodiment, the design flexibility for arranging the inductor ID5 can be increased without hindering the miniaturization of the semiconductor chip CP1, and the reliability of the semiconductor module MJ3 can be improved.

Further, the planar size of the inductor ID5 is larger than the planar size of the semiconductor chip CP1. For this reason, in the third embodiment semiconductor module MJ3, it is possible to increase the magnetic sensitivity from the power line EPLs as compared with the case where an inductor for a magnetic sensor is formed inside the semiconductor chip CP1.

Hereinafter, the semiconductor module MJ4 according to the fourth embodiment will be described with reference to FIG. 16. Hereinafter, differences from the semiconductor module MJ3 according to the third embodiment will be mainly described.

Figure 16:
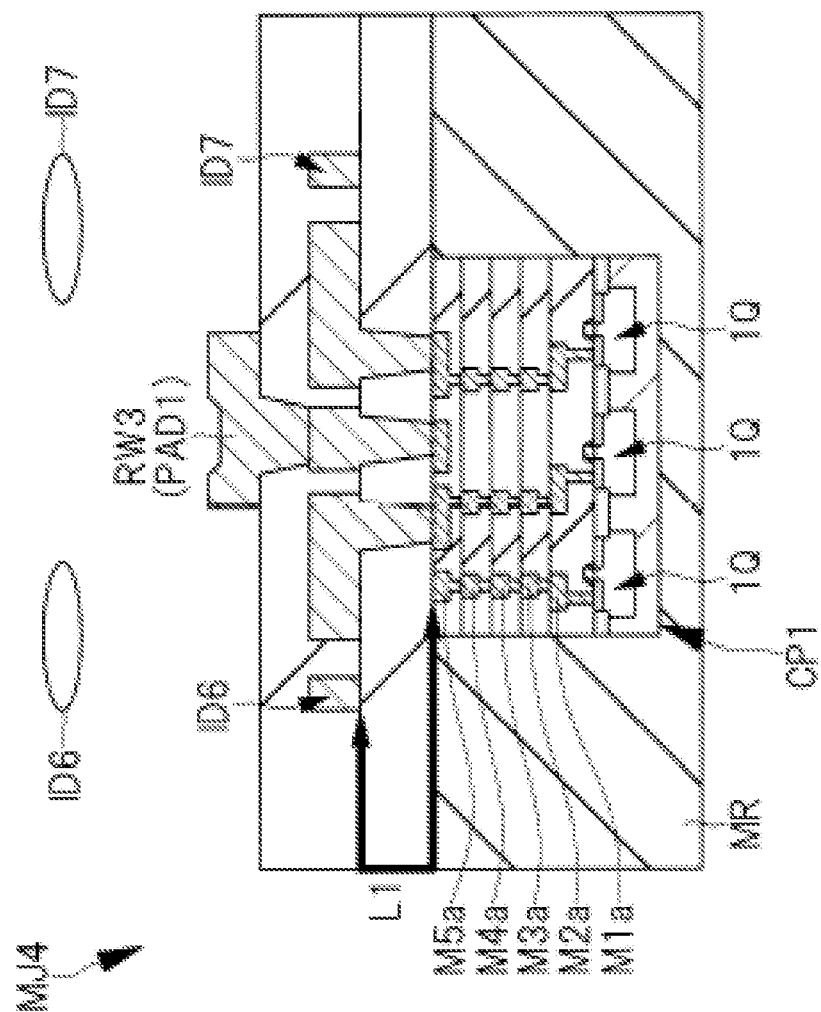
FIG. 16 is a cross-sectional view illustrating a semiconductor module according to a fourth embodiment.

As shown in FIG. 16, in the fourth embodiment, the inductor ID6 and the inductor ID7 are individually formed in the same layers as the redistribution wiring RW1, and are used for sensing magnetism from the outside of the semiconductor module MJ, and constitute a part of electric circuit for the magnetic sensor (power meter) of the semiconductor module MJ.

The inductor ID6 and the inductor ID7 are electrically connected to the MISFET 1Q via the redistribution wiring RW1 and the wiring M1a to M5a, respectively. In fourth embodiment, an inductor ID6 and an inductor ID7 are electrically connected to different MISFET 1Q, each of which constitutes a part of an electric circuit for a magnetic sensor. The MISFET 1Q, the inductor ID6, and the inductor ID7 constitute a differential magnetic sensor (power meter). Therefore, the sensitivity of the magnetic sensor can be increased, and the S/N ratio (SNR: Signal to Noise Ratio) can be improved.

Although the invention made by the inventors of the present application has been specifically described based on the embodiments, the present invention is not limited to the above-described embodiments, and various modifications can be made without departing from the gist thereof.

What is claimed is:

1. A semiconductor module comprising:
   a first semiconductor chip comprising:
     a first semiconductor substrate;
     a first multilayer wiring layer formed on the first semiconductor substrate; and
     a first wiring formed in an uppermost layer of the first multilayer wiring layer;
   a sealing resin part covering at least a side surface of the first semiconductor chip such that the first wiring is exposed; and
   a first inductor formed over the first wiring and overlapping with the sealing resin part covering the side surface of the first semiconductor chip in plan view.

2. The semiconductor module according to claim 1, wherein a distance between the first inductor and the side surface of the semiconductor module is greater than a distance between the first wiring and the side surface of the first semiconductor chip.

3. The semiconductor module according to claim 1, wherein the first inductor overlaps with the first semiconductor chip in plan view.

4. The semiconductor module according to claim 1, wherein the first semiconductor chip comprises a first semiconductor element formed in the first semiconductor substrate below the first multilayer wiring layer and electrically connected with the first inductor.

5. The semiconductor module according to claim 4, comprising:
   a second semiconductor chip comprising:
      a second semiconductor substrate;
      a second semiconductor element formed in the second semiconductor substrate;
      a second multilayer wiring layer formed on the second semiconductor element; and
      a second wiring formed in the uppermost layer of the second multilayer wiring layer;
   a first redistribution wiring formed over the first wiring and the second wiring; and
   a second redistribution wiring formed over the first redistribution wiring,
   wherein at least a side surface of the second semiconductor chip is covered by the sealing resin part such that the second wiring is exposed,
   wherein the first inductor is formed in the same layer as the first redistribution wiring,
   wherein a second inductor is formed in the same layer as the second redistribution wiring with overlapping with the first inductor in plan view, and
   wherein the second inductor and the second semiconductor element are electrically connected with each other.

6. The semiconductor module according to claim 4, comprising:
   a second semiconductor chip comprising:
      a second semiconductor substrate;
      a second semiconductor element formed in the second semiconductor substrate;
      a second multilayer wiring layer formed on the second semiconductor element; and
      a second wiring formed in the uppermost layer of the second multilayer wiring layer; and
   a first redistribution wiring formed over the first wiring and the second wiring,
   wherein at least a side surface of the second semiconductor chip is covered by the sealing resin part such that the second wiring is exposed,
   wherein the first inductor is formed in the same layer as the first redistribution wiring, and
   wherein a second inductor is formed in the same layer as the first redistribution wiring and is electrically connected with the second semiconductor element.

7. The semiconductor module according to claim 6, wherein a planar size of each of the first inductor and the second inductor is greater than a planar size of the first semiconductor chip.

8. The semiconductor module according to claim 4, wherein the first inductor and the first semiconductor element constitute a part of an electric circuit for a magnetic sensor, the electric circuit being configured to detect magnetism from an outside of the semiconductor module.

9. The semiconductor module according to claim 8, wherein a planar size of the first inductor is greater than a planar size of the first semiconductor chip.

10. The semiconductor module according to claim 4, comprising a second inductor formed over the first wiring,
    wherein the first semiconductor chip comprises a third semiconductor element formed in the first semiconductor substrate and electrically connected with the second inductor, and
    wherein the first inductor, the first semiconductor element, the second inductor, and the third semiconductor element constitute a part of an electric circuit for a differential magnetic sensor, the electric circuit being configured to detect magnetism from an outside of the semiconductor module.

11. A method of manufacturing a semiconductor module, comprising:
    (a) providing a first semiconductor chip comprising:
       a first semiconductor substrate;
       a first multilayer wiring layer formed on the first semiconductor substrate; and
       a first wiring formed in an uppermost layer of the first multilayer wiring layer;
    (b) forming a sealing resin part covering at least a side surface of the first semiconductor chip so as to expose the first wiring;
    (c) forming a first insulating film on the sealing resin part and a surface of the first semiconductor chip comprising the first wiring;
    (d) forming a first resist pattern having a plurality of first openings on the first insulating film;
    (e) forming a first conductive film in each of the plurality of first openings by plating method; and
    (f) removing, after the (e), the first resist pattern to form a plurality of a first redistribution wirings, each of the plurality of the first redistribution wirings comprising the first conductive film,
    wherein a first inductor is included in a part of the plurality of the first redistribution wirings, and
    wherein the first inductor is formed at a position different a position overlapping with the sealing resin part covering the side surface of the first semiconductor chip in plan view.

12. The method of manufacturing a semiconductor module according to claim 11,
    wherein the (a) comprises:
       (a1) forming a first interlayer insulating film on the first semiconductor substrate;
       (a2) forming a first trench in the first interlayer insulating film;
       (a3) forming a second conductive film on the first interlayer insulating film including the interior of the first trench; and
       (a4) polishing the second conductive film outside the first trench to form the first wiring comprising the second conductive film inside the first trench, and
    wherein a distance between the first inductor and the side surface of the semiconductor module is greater than a distance between the first wiring and the side surface of the first semiconductor chip.

13. The method of manufacturing a semiconductor module according to claim 11, wherein the first inductor overlaps with the first semiconductor chip in plan view.

14. The method of manufacturing a semiconductor module according to claim 11, wherein the (b) comprises:
    (b1) providing a support substrate and an adhesive agent formed on the support substrate;
    (b2) mounting the first semiconductor chip on the adhesive agent so as to adhere the surface of the first semiconductor chip to the adhesive agent;

(b3) forming, after the (b2), the sealing resin part so as to cover the side surface and the back surface of the first semiconductor chip; and (b4) removing, after the (b3), the adhesive agent and the support substrate.

15. The method of manufacturing a semiconductor module according to claim 11, wherein the first semiconductor chip further comprises a first semiconductor element formed in the first semiconductor substrate below the first multilayer wiring layer and electrically connected with the first inductor.

16. The method of manufacturing a semiconductor module according to claim 15, wherein a planar size of the first inductor is greater than a planar size of the first semiconductor chip.

17. The method of manufacturing a semiconductor module according to claim 15, comprising:

(g) forming, after the (f), a second insulating film on the plurality of first redistribution wirings and the first insulating film comprising the first inductor;

(h) forming a second resist pattern having a plurality of second openings on the second insulating film;

(i) forming a second conductive film in each of the plurality of second openings by plating method;

(j) removing the second resist pattern to form a plurality of second redistribution wirings, each of plurality of second redistribution wirings comprising the second conductive film, wherein a part of the plurality of second redistribution wirings includes a second inductor, wherein the second inductor overlaps with the first inductor in plan view, wherein, in the (a), a second semiconductor chip is provided, the second semiconductor chip comprising:
a second semiconductor substrate;
a second semiconductor element formed in the second semiconductor substrate;
a second multilayer wiring layer formed on the second semiconductor element; and
a second wiring formed in the uppermost layer of the second multilayer wiring layer, wherein, in the (b), at least a side surface of the second semiconductor chip is covered with the sealing resin part so as to expose the second wiring, and wherein the second inductor and the second semiconductor element are electrically connected with each other.

18. The method of manufacturing a semiconductor module according to claim 15, comprising:
wherein the plurality of first redistribution wirings includes a second inductor,
wherein, in the (a), a second semiconductor chip is provided, the second semiconductor chip comprising:
a second semiconductor substrate;
a second semiconductor element formed in the second semiconductor substrate;
a second multilayer wiring layer formed on the second semiconductor element; and
a second wiring formed in the uppermost layer of the second multilayer wiring layer,
wherein, in the (b), at least a side surface of the second semiconductor chip is covered with the sealing resin part so as to expose the second wiring, and
wherein the second inductor and the second semiconductor element are electrically connected with each other.

19. The method of manufacturing a semiconductor module according to claim 15, comprising:
wherein the plurality of first redistribution wirings includes a second inductor,
wherein the first semiconductor chip comprises a third semiconductor element formed in the first semiconductor substrate, and
wherein the second inductor and the third semiconductor element are electrically connected with each other.

* * * * *